(12) United States Patent
Li et al.

(10) Patent No.: US 11,749,538 B2
(45) Date of Patent: *Sep. 5, 2023

(54) DEVICE FOR DEGUMMING AND INSERTING SILICON WAFERS AND METHOD FOR PROCESSING SILICON WAFERS

(71) Applicant: HANGZHOU ZHONGWEI PHOTOELECTRIC TECHNOLOGY CO., LTD., Hangzhou (CN)

(72) Inventors: Hong Li, Hangzhou (CN); Hong Chen, Hangzhou (CN); Jian Jing, Hangzhou (CN); Jiangshui Zhang, Hangzhou (CN); Jun Wang, Hangzhou (CN); Guangquan Zhang, Hangzhou (CN); Pucha Hu, Hangzhou (CN)

(73) Assignee: HANGZHOU ZHONGWEI PHOTOELECTRIC TECHNOLOGY CO., LTD., Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/887,456

(22) Filed: Aug. 14, 2022

(65) Prior Publication Data

US 2023/0005764 A1    Jan. 5, 2023

Related U.S. Application Data

(63) Continuation of application No. PCT/CN2022/101212, filed on Jun. 24, 2022.

(30) Foreign Application Priority Data

Jul. 1, 2021  (CN) .......................... 202110746252.9
Aug. 2, 2021  (CN) .......................... 202110883129.1

(51) Int. Cl.
*H01L 21/67* (2006.01)
*H01L 21/687* (2006.01)
(Continued)

(52) U.S. Cl.
CPC .... *H01L 21/67051* (2013.01); *H01L 21/0206* (2013.01); *H01L 21/67706* (2013.01);
(Continued)

(58) Field of Classification Search
CPC ......... H01L 21/67313; H01L 21/67766; H01L 21/67051; H01L 21/67086;
(Continued)

(56) References Cited

U.S. PATENT DOCUMENTS

2023/0005774 A1* 1/2023 Li .................... H01L 21/67706

FOREIGN PATENT DOCUMENTS

CN    206584911 U    10/2017
CN    211366215 U    8/2020
(Continued)

OTHER PUBLICATIONS

Machine Translation of WO-2014012294-A1 to Jin et al. Jan. 2014. (Year: 2014).*

(Continued)

*Primary Examiner* — Benjamin L Osterhout

(57) ABSTRACT

The present disclosure provides a device (300) for degumming and inserting silicon wafers and method for processing silicon wafers. The device (300) for degumming and inserting silicon wafers includes a material frame (1), a grabbing mechanism (2), a degumming mechanism (3), an unlocking mechanism (8) and an inserting mechanism (4). The material frame (1) is configured for placing and clamping a plurality of silicon wafers (100) bonded with a support (200), the grabbing mechanism (2) is configured for grabbing and transferring the material frame (1) or the support (200), the
(Continued)

degumming mechanism (3) is configured for degumming the plurality of silicon wafers (100) from the support (200), the unlocking mechanism (8) is configured for releasing clamping and fixing of the material frame (1) on the plurality of silicon wafers (100), and the inserting mechanism (4) is configured for splitting the degummed plurality of silicon wafers (100).

16 Claims, 13 Drawing Sheets

(51) Int. Cl.
    *H01L 21/677* (2006.01)
    *H01L 21/02* (2006.01)
    *H01L 21/673* (2006.01)

(52) U.S. Cl.
    CPC .. *H01L 21/67742* (2013.01); *H01L 21/67766* (2013.01); *H01L 21/67057* (2013.01); *H01L 21/67086* (2013.01); *H01L 21/67313* (2013.01); *H01L 21/68707* (2013.01); *Y02P 70/50* (2015.11)

(58) Field of Classification Search
    CPC ......... H01L 21/67706; H01L 21/67057; H01L 21/67742; H01L 21/0206; H01L 21/68707; Y02P 70/50
    See application file for complete search history.

(56) References Cited

FOREIGN PATENT DOCUMENTS

| | | | |
|---|---|---|---|
| CN | 212322972 U | 1/2021 | |
| CN | 112718643 A | 4/2021 | |
| CN | 212874466 U | 4/2021 | |
| CN | 112850161 A | 5/2021 | |
| CN | 113488425 A | 10/2021 | |
| WO | WO-2014012294 A1 * | 1/2014 | ............ G03F 7/423 |
| WO | WO2019029813 A1 | 2/2019 | |

OTHER PUBLICATIONS

International Search Report of PCT/CN2022/101212.
China Office Action of 202110883129.1.

* cited by examiner

DEVICE FOR DEGUMMING AND INSERTING SILICON WAFERS AND METHOD FOR PROCESSING SILICON WAFERS

CROSS-REFERENCE TO RELATED APPLICATIONS

This application is a continuation of PCT patent application PCT/CN2022/101212 filed on Jun. 24, 2022, which claims all benefits accruing from China Patent Application Nos. 202110746252.9, filed on Jul. 1, 2021, titled "DEVICE FOR DEGUMMING AND INSERTING SILICON WAFERS", and 202110883129.1, filed on Aug. 2, 2021, titled "DEVICE FOR DEGUMMING AND INSERTING SILICON WAFERS AND METHOD FOR PROCESSING SILICON WAFERS", in the China National Intellectual Property Administration, the contents of which are hereby incorporated by reference.

TECHNICAL FIELD

The present disclosure relates to a field of silicon wafer manufacturing, and in particular, to a device for degumming and inserting silicon wafers and method for processing silicon wafers.

BACKGROUND

Photovoltaic silicon wafers or semiconductor silicon wafers are cut from a silicon bar glued to a support by a wire cut electrical discharge machine. In a process of a related art, the silicon wafers are still glued to the support after wire cutting process, and transported by hand or multi-function transport vehicle (such as AGV, Automated Guided Vehicle) to a separate degumming machine for degumming. After degumming, the silicon wafers are taken out from acid-containing water and put into an elastic clip, and the elastic clip is put into a water tank. Then the water tank is transported to a device for inserting a silicon wafer by hand or the AGV, and the elastic clip is taken out and put into the device for inserting the silicon wafers manually. However, manual transportation of the silicon wafers has the following problems. Firstly, it is necessary to manually transport the silicon wafers from the acid-containing water, and the acid-containing water contains a large amount of silicon powder and a small amount of acid, which is harmful to human body. Secondly, because the silicon wafers are very thin and brittle, a slight collision during the manual transportation of the silicon wafers can cause defective products such as chipping and fragments of silicon wafers. Thirdly, it is necessary to transport the silicon wafers to the elastic clip, since the manual transportation of the silicon wafers takes a long time for transportation, gaps between the silicon wafers will be reduced, and a great force is required in a stage of inserting the silicon wafer to separate the silicon wafers. The great force may easily cause the silicon wafers to crack or even produce fragments.

SUMMARY

According to various embodiments of the present disclosure, a device for degumming and inserting silicon wafers and method for processing silicon wafers are provided.

The present disclosure provides a device for degumming and inserting silicon wafers. The device for degumming and inserting silicon wafers includes a material frame, a grabbing mechanism, a degumming mechanism, an unlocking mechanism and an inserting mechanism. The material frame is configured for placing and clamping a plurality of silicon wafers bonded with a support, the grabbing mechanism is configured for grabbing and transferring the material frame or the support, the degumming mechanism is configured for degumming the plurality of silicon wafers from the support, the unlocking mechanism is configured for releasing clamping and fixing of the material frame on the plurality of silicon wafers, and the inserting mechanism is configured for splitting the degummed plurality of silicon wafers.

In some embodiments, the inserting mechanism includes a conveying component, a clamping component, and a spraying component. The conveying component is configured for placing and conveying the plurality of silicon wafers. The clamping component is disposed at two sides of the conveying component, the clamping component is capable of clamping the plurality of silicon wafers and conveying the plurality of silicon wafers synchronously. And the spraying component is disposed at an end of the conveying component, the plurality of silicon wafers are conveyed to the end of the conveying component proximal to the spraying component via the conveying component and the clamping component, and the spraying component is capable of spraying water on the plurality of silicon wafers to separate adjacent two of the plurality of silicon wafers.

In some embodiments, the clamping component includes a side belt conveying member and a clamping driving unit, the side belt conveying member are disposed at the two sides of the conveying component, and the clamping driving unit is connected to the side belt conveying member and capable of driving belts of the side belt conveying member to move toward or away from each other, in order to clamp the plurality of silicon wafers or release a clamping of the plurality of silicon wafers.

In some embodiments, the conveying component includes a bottom belt conveying member, an end of the bottom belt conveying member proximal to the spraying component protruding forward is defined as an anterior region, and the spraying component is located a side of the anterior region In some embodiments, the degumming mechanism includes a degumming tank, an acid storage tank, and a water storage tank, and the acid storage tank and the water storage tank are communicated with the degumming tank through pipes, respectively. A first control component is arranged on the pipe between the degumming tank and the acid storage tank, and the first control component is capable of controlling a communication between the degumming tank and the acid storage tank or cutting off the communication between the degumming tank and the acid storage tank. And a second control component is arranged on the pipe between the degumming tank and the water storage tank, and the second control component is capable of controlling a communication between the degumming tank and the water storage tank or cutting off the communication between the degumming tank and the water storage tank.

In some embodiments, the degumming tank is provided with a spraying pipe, the spraying pipe is provided with a plurality of spraying holes, which are uniformly distributed at intervals along a length direction of the spraying pipe. The second control component includes a second liquid pump, and the second liquid pump is capable of delivering liquid to the spraying pipe and spraying the liquid from the plurality of spraying holes toward adjacent two of plurality of silicon wafers.

In some embodiments, the material frame includes a main frame body and first clamping members opposite to each other. The main frame body is provided with a material tank, the material tank is provided with a wafer outlet, and the wafer outlet is configured for allowing one of the plurality of silicon wafers to pass through. The first clamping members are rotatably connected to the main frame body via first rotating shafts, respectively, and the two first clamping members are capable of moving toward or away from each other by rotating the first rotating shafts so as to clamp the plurality of silicon wafers or release a clamping of the plurality of silicon wafers.

In some embodiments, a buffering region is provided between the degumming mechanism and the inserting mechanism, and the buffering region is configured for accommodating the material frame clamped with the plurality of silicon wafers or the empty material frame. In this way, the material frame clamped with degummed silicon wafers can be first placed on the buffering region to wait for a subsequent process of inserting the silicon wafer, so as to avoid the device for degumming and inserting silicon wafers running poorly due to no place to place the material frame.

In some embodiments, the degumming mechanism is located on a side of the inserting mechanism, the degumming mechanism and the inserting mechanism are arranged on the same horizontal plane, and the grabbing mechanism is arranged above the degumming mechanism and the inserting mechanism. In this way, a structure of the device for degumming and inserting silicon wafers can be more compact, and operation efficiency of the device for degumming and inserting silicon wafers can be improved.

The present disclosure further provides a method for processing a silicon wafer using the device for degumming and inserting silicon wafers described above, including:

step 1, placing the material frame with the plurality of silicon wafers at a feeding region;

step 2, grabbing and moving the material frame with the plurality of silicon wafers to the degumming mechanism via the grabbing mechanism, to perform a degumming treatment so as to separate the plurality of silicon wafers from the support;

step 3, grabbing and moving the material frame with the plurality of silicon wafers to the inserting mechanism;

step 4, releasing a clamping and fixing of the plurality of silicon wafers from the material frame via the unlocking mechanism; and step 5, splitting the degummed plurality of silicon wafers via the inserting mechanism.

The details of one or more embodiments of the present disclosure are set forth in the accompanying drawings and the description below. Other features, objects and advantages of the present disclosure will become apparent from the description, drawings and claims.

BRIEF DESCRIPTION OF THE DRAWINGS

To describe and illustrate embodiments and/or examples of the present disclosure made public here better, reference may be made to one or more of the figures. The additional details or embodiments used to describe the figures should not be construed as limiting the scope of any of the present disclosure, the embodiments and/or examples currently described, and the best model of the present disclosure as currently understood.

Figure 1:
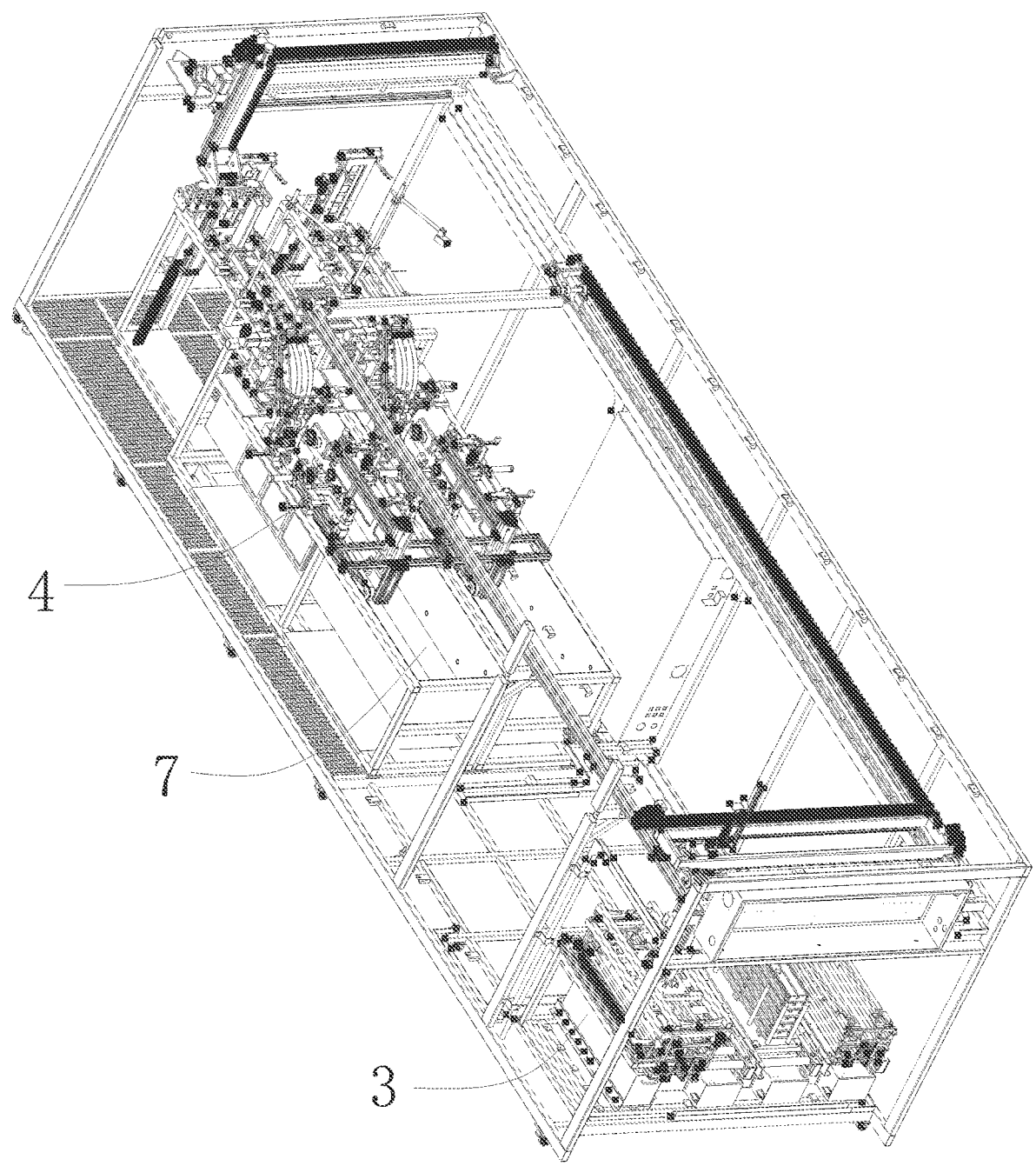
FIG. 1 is a structural diagram of a device for degumming and inserting silicon wafers in one or more embodiments of the present disclosure.

In the figures, 100 represents a silicon wafer, 200 represents a support, 300 represents a device for degumming and inserting silicon wafers, 1 represents a material frame, 11 represents a main frame body, 111 represents a material tank, 112 represents a wafer outlet, 12 represents a second clamping member, 13 represents a second rotating shaft, 14 represents a first clamping member, 15 represents a first rotating shaft, 16 represents a sliding block, 17 represents a sliding groove, 18 represents a first connecting rod, 19 represents a second connecting rod, 2 represents a grabbing mechanism, 21 represents a frame manipulator, 22 represents a lifting assembly, 23 represents a longitudinal guide rail, 24 represents a transverse guide rail, 3 represents a degumming mechanism, 31 represents a degumming tank, 32 represents an acid storage tank, 33 represents a water storage tank, 34 represents a spraying pipe, 341 represents a spraying hole, 342 represents a side nozzle, 343 represents a bottom nozzle, 35a represents a first control component, 35 represents a second liquid pump, 36a represents a second control component, 36 represents a first liquid pump, 37 represents a pipe, 4 represents an inserting mechanism, 41 represents a conveying component, 411 represents a bottom belt conveying member, 412 represents an anterior region, 42 represents a clamping component, 421 represents a side belt conveying member, 422 represents a clamping driving unit, 43 represents a spraying component, 5 represents a single piece cleaning mechanism, 6 represents a feeding region, 7 represents a buffering region, and 8 represents an unlocking mechanism.

DETAILED DESCRIPTION

The technical solutions in the embodiments of the present disclosure are clearly and completely described in the following with reference to the accompanying drawings in the embodiments of the present disclosure. It is obvious that the described embodiments are only a part of the embodiments, but not all of the embodiments. All other embodiments obtained by those skilled in the art based on the embodiments of the present disclosure without making creative labor are the scope of the present disclosure.

In the description of the present disclosure, it should be understood that terms such as "center", "vertical", "horizontal", "parallel", "length", "width", "thickness", "above", "below", "front", "back", "left", "right", "upright", "aclinic", "top", "bottom", "inner", "outer", "clockwise", "counterclockwise", "axial", "radial", "circumferential", etc. to instruct orientation or positional relationship is based on the orientation and positional relationship shown in the drawings, and is only for the convenience of describing the disclosure and simplifying the description, rather than instructing or implying that the device or element referred to must have a specific orientation or be constructed and operated in a specific orientation, so it should not be understood as limiting the specific protection scope of the disclosure.

In addition, the terms "first" and "second" are only used for descriptive purposes, and cannot be understood as indicating or implying relative importance or implying the number of indicated technical features. Thus, features delimited with "first", "second" may expressly or implicitly include at least one of the features. In the description of the present disclosure, unless expressly and specifically defined otherwise, "plurality" means at least two, such as two, three, etc.

In the present disclosure, unless clearly defined otherwise, the terms "install", "linked to", "connected to", and "fixed to" should be understood in a broad sense. For example, the connection includes a fixed connection, a detachable connection, or an integrated connection, it can be a mechanical connection, or an electrical connection, and it can be directly connected, or indirectly connected through an intermediate medium. And it can be internal communication between two components or interaction between two elements, unless expressly defined otherwise. For those of ordinary skill in the art, the specific meanings of the above terms in this disclosure can be understood according to specific situations.

In the present application, unless otherwise explicitly specified and defined, the expression a first feature being "on" or "underneath" a second feature may be the case that the first feature is in direct contact with the second feature, or the first feature is in indirect contact with the second feature via an intermediate medium. Furthermore, the expression the first feature being "over", "above" and "on top of" the second feature may be the case that the first feature is directly above or obliquely above the second feature, or only means that the level of the first feature is higher than that of the second feature. The expression the first feature being "under", "below" and "beneath" the second feature may be the case that the first feature is directly below or obliquely below the second feature, or only means that the level of the first feature is less than that of the second feature.

It should be noted that when an element is referred to as being "fixed to" or "disposed on" another element, it may be directly fixed to or disposed on the other element or a further element may be presented between them. When an element is considered to be "connected" to another element, it may be directly connected to the other element or connected to the other element through a further element. The terms "vertical", "horizontal", "upper", "lower", "left", "right" and similar expressions used in this application are for illustrative purposes only and are not intended to be the only implementation.

Unless otherwise defined, all technical and scientific terms used herein have the same meaning as a skilled person in the art would understand. The terminology used in the description of the present disclosure is for the purpose of describing particular embodiments and is not intended to limit the disclosure. The term "or/and" as used herein includes any and all combinations of one or more of the associated listed items.

Referring to FIG. 1 to FIG. 4, when processing a silicon wafer 100, a silicon bar can usually be bonded to a support 200, and then a plurality of silicon wafers 100 can be formed by a cutting processing of the silicon bar. However, after the cutting processing, the silicon wafers 100 are still bonded on the support 200. The device for degumming and inserting silicon wafers provided by this application can realize separation of the plurality of silicon wafers 100 and the support 200 without a need to manually move the silicon wafers 100, and make the bonded silicon wafers 100 split into single silicon wafer 100.

Referring to FIG. 1 to FIG. 4 and FIG. 13, the device for degumming and inserting silicon wafers provided by the present embodiment can include a material frame 1, a grabbing mechanism 2, a degumming mechanism 3, an unlocking mechanism 8, an inserting mechanism 4, a separation conveying mechanism (not shown), a single piece cleaning mechanism 5 and a drying mechanism (not shown). The material frame 1 provided by the present embodiment is different from a conventional material frame in a related art. The conventional material frame can only clamp the support 200, while the material frame 1 provided by the present embodiment can not only clamp the support 200, but also clamp the silicon wafer 100. In this way, after the separation of the support 200 and the silicon wafer 100, the silicon wafer 100 does not need to be taken out from the material frame 1, but can be directly transferred to the inserting mechanism 4 by the material frame 1. Moreover, the grabbing mechanism 2 provided by the present embodiment can grab the material frame 1 and the support 200 respectively, and transport the material frame 1 and the support 200 separately or together. Specifically, when the support 200 and the silicon wafers 100 are not separated, the grabbing mechanism 2 can grab and transfer the material frame 1 and the support 200 and the silicon wafers 100 placed in the material frame 1 simultaneously. And when the silicon wafers 100 is separated from the support 200, the grabbing mechanism 2 can transport the support 200 away separately, and then transfer the material frame 1 together with the silicon wafers 100. The degumming mechanism 3 is configured for degumming the silicon wafers 100 from the support 200, and the silicon wafers 100 and the support 200 can be separated by the degumming mechanism 3. Usually, the degumming mechanism 3 can be provided with a degumming agent such as lactic acid. According to similarity-intermiscibility theory, adhesives between the silicon wafers 100 and the support 200 can be dissolved in the degumming agent, thereby realizing degumming and separation of the silicon wafers 100 and the support 200. During a transfer process of the silicon wafer 100, the material frame 1 can clamp the silicon wafer 100. Therefore, before the silicon wafers 100 are split, the unlocking mechanism 8 can be configured for releasing a clamping and fixing of the material frame 1 to the silicon wafers 100, thus facilitating the separation of the adjacent silicon wafers 100. The inserting mechanism can be configured for splitting the degummed plurality of silicon wafers 100, so that the bonded silicon wafers 100 can be separated into single piece of silicon wafer. The thickness of the single piece of silicon wafer 100 can be extremely thin. Generally, the thickness of a photovoltaic silicon wafer can be in a range between 0.13 mm and 0.18 mm, and the thickness of the semiconductor silicon wafer can be about 0.7 mm. Therefore, the single piece of silicon wafer 100 needs to be transported separately by the separation conveying mechanism. Moreover, there is a certain amount of impurities in a single piece of silicon wafer 100, therefore, the silicon wafer 100 can be transferred to the single piece cleaning mechanism 5 to clean. After cleaning, the single piece of silicon wafer 100 can be transferred to the drying mechanism for drying. In order to improve operation efficiency of the device 300 for degumming and inserting silicon wafers. In the present embodiment, the degumming mechanism 3 can be located on a side of the inserting mechanism 4, the degumming mechanism 3 and the inserting mechanism 4 can be arranged on the same horizontal plane, and the grabbing mechanism 2 can be arranged above the degumming mechanism 3 and the inserting mechanism 4. In this way, a structure of the device 300 for degumming and inserting silicon wafers can be more compact, and operation efficiency thereof can be improved.

Specifically, the method for processing a silicon wafer using the device for degumming and inserting silicon wafers mentioned above includes the following steps: firstly, placing the material frame 1 with the plurality of silicon wafers 100 at a feeding region 6; secondly, grabbing and moving the material frame 1 with the plurality of silicon wafers 100 to the degumming mechanism 3 via the grabbing mechanism 2, to perform a degumming treatment so as to separate the plurality of silicon wafers 100 from the support 200; thirdly, grabbing and removing the support 200 separated from the plurality of silicon wafers 100 via the grabbing mechanism 2, and then grabbing and moving the material frame 1 with the plurality of silicon wafers 100 to the inserting mechanism 4; fourthly, releasing the clamping and fixing of the plurality of silicon wafers 100 from the material frame 1 via the unlocking mechanism 8, and then splitting the degummed plurality of silicon wafers 100 via the inserting mechanism 4; and finally, cleaning and drying one of the plurality of silicon wafers. It can be seen from the above that the device 300 for degumming and inserting silicon wafers provided by the present disclosure does not require manual transportation of the silicon wafer 100 during an entire processing, thereby avoiding a serious damage to the silicon wafer 100 and preventing a human body from being corroded by wastewater.

Figure 2:
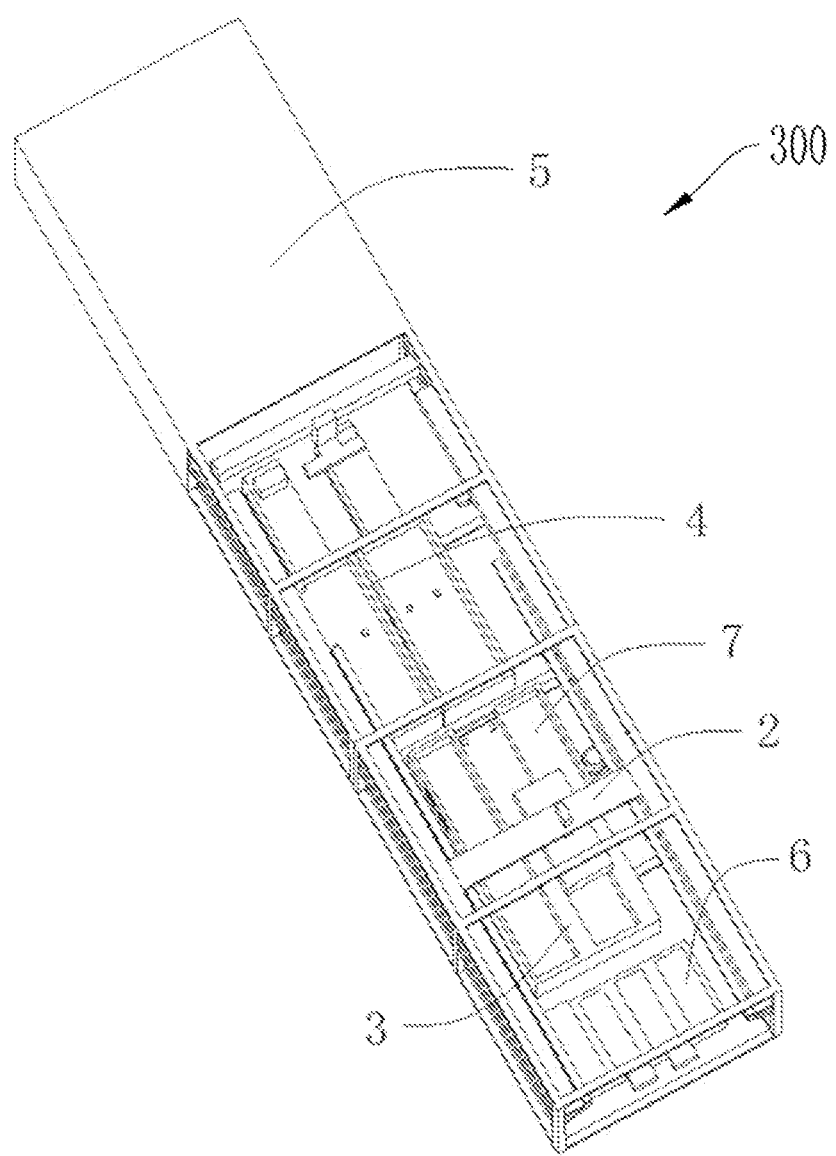
FIG. 2 is a schematic structural diagram of a device for degumming and inserting silicon wafers in one or more embodiments of the present disclosure.
Figure 3:
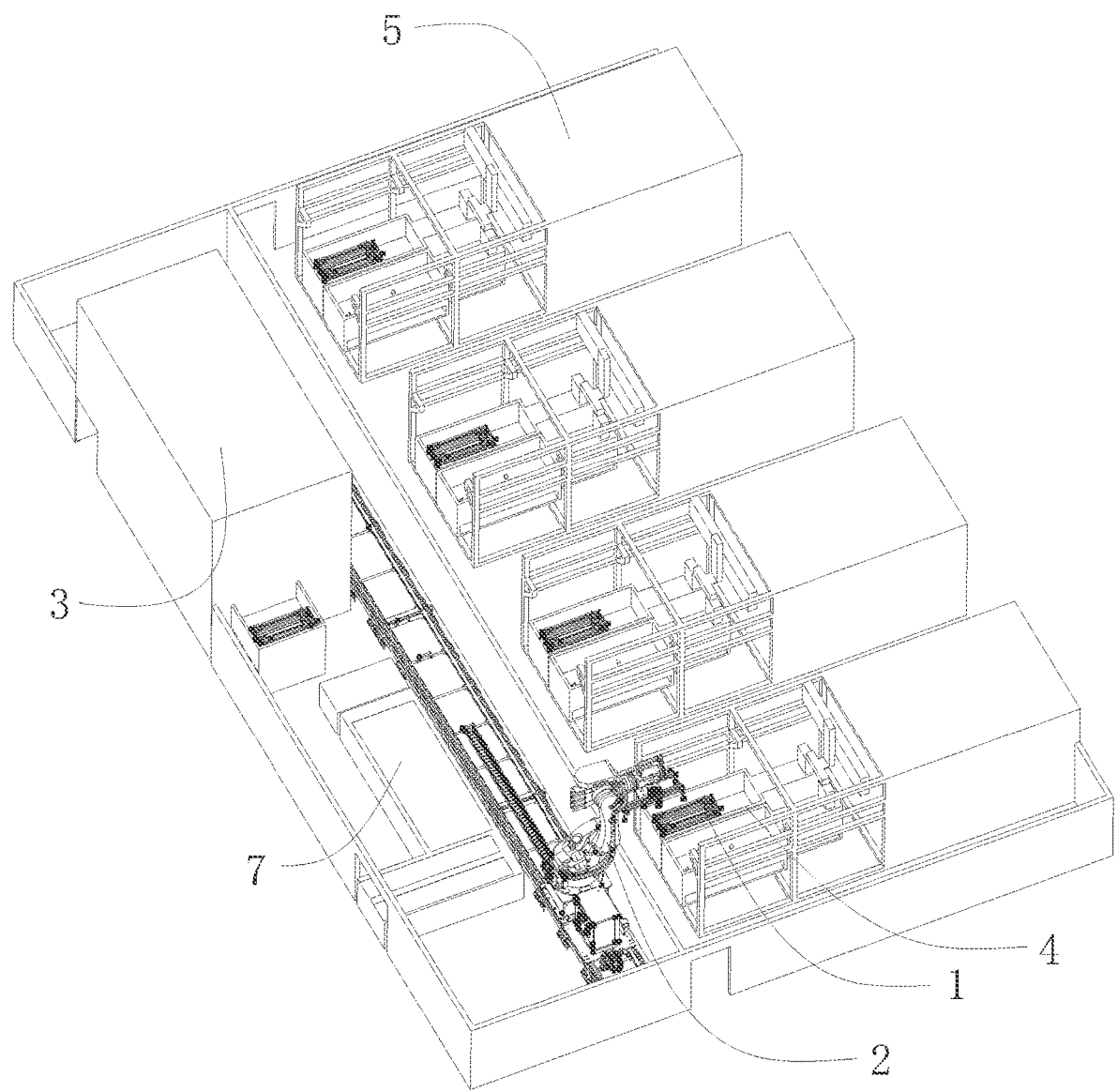
FIG. 3 is a schematic structural diagram of a device for degumming and inserting silicon wafers in one or more embodiments of the present disclosure.
Figure 4:
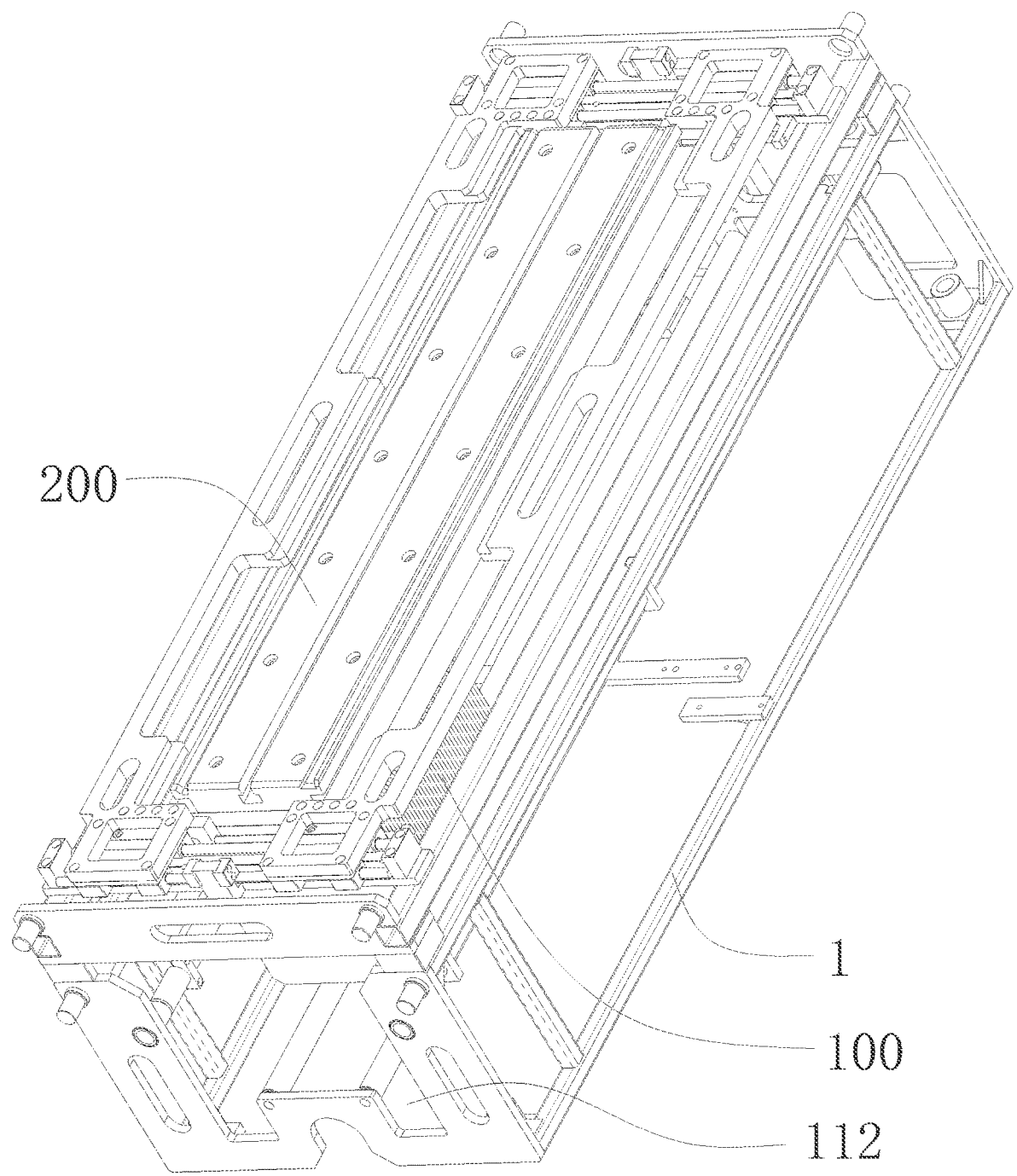
FIG. 4 is a structural diagram of a material frame provided with a plurality of silicon wafers and a support of a device for degumming and inserting silicon wafers in one or more embodiments of the present disclosure.

Referring to FIG. 1 to FIG. 3, since an inserting process of inserting the silicon wafer 100 is after a degumming process of degumming the silicon wafer 100, and time required for the inserting process of the inserting mechanism 4 is longer than time required for the degumming process of the degumming mechanism 3. Therefore, after the plurality of silicon wafers 100 are degummed, an inserting treatment cannot be performed immediately, that is, after the plurality of silicon wafers 100 are degummed, it needs to wait for a period of time before performing the degumming treatment. In this way, smoothness of the overall operation of the device for degumming and inserting silicon wafers can be affected. In order to improve the smoothness of the overall operation of the device for degumming and inserting silicon wafers, in the present disclosure, a buffering region 7 can be provided between the degumming mechanism and the inserting mechanism. The buffering region 7 can be configured for accommodating the material frame 1 clamped with the plurality of silicon wafers 100 or the empty material frame 1. In this way, the material frame 1 clamped with the degummed silicon wafer 100 can be placed on the buffering region 7 to wait for the subsequent inserting process, so as to prevent the device for degumming and inserting silicon wafers from operating unsmoothly due to nowhere to place the material frame 1. Furthermore, in order to improve operation efficiency of the device for degumming and inserting silicon wafers, and reduce waiting time of the material frame 1 before the inserting process, in the device for degumming and inserting silicon wafers provided by the present disclosure, the number of the inserting mechanisms 4 can also be twice greater than or equal to that of the degumming mechanism 3. That is, one degumming mechanism 3 can correspond to at least two inserting mechanisms 4, thus greatly improving smoothness of the overall operation and operation efficiency of the device for degumming and inserting silicon wafers.

A specific structure of the device for degumming and inserting silicon wafers can be further analyzed below.

Figure 5:
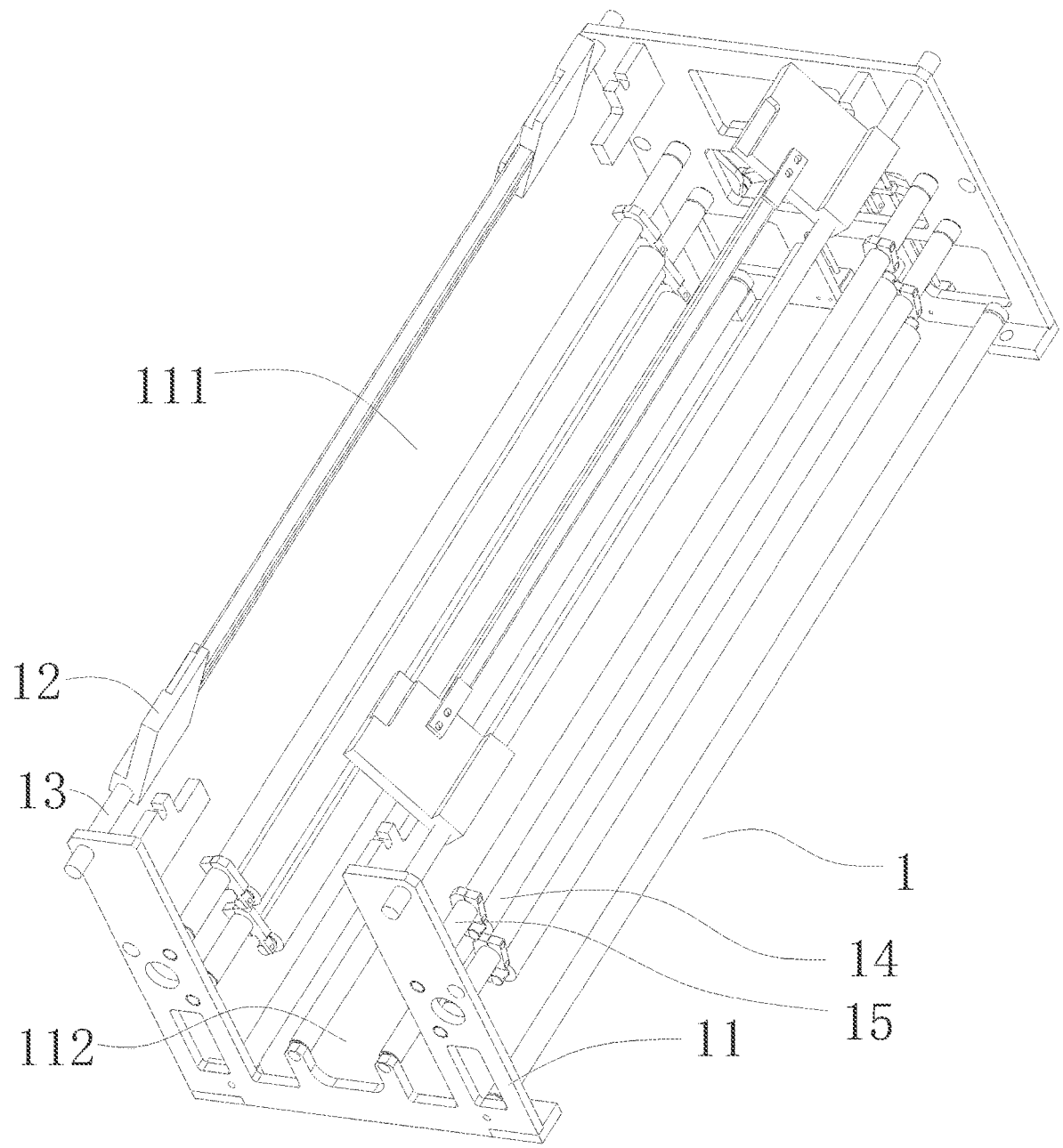
FIG. 5 is a structural diagram of a material frame of a device for degumming and inserting silicon wafers in one or more embodiments of the present disclosure.

In some embodiments, referring to FIG. 5, the material frame 1 can include a main frame body 11, the main frame body 11 can be provided with a material tank 111, and the plurality of silicon wafers 100 and the support 200 can be provided in the material tank 111. The material tank 111 can be provided with a wafer outlet 112, and the wafer outlet 112 can be configured for allowing one of the plurality of silicon wafers to pass through. In this way, the single silicon wafer 100 split by the inserting mechanism 4 can be transferred from the material tank 111 directly through the wafer outlet 112. Two second clamping members 12 opposite to each other can be provided on two side walls of the material tank 111, and the two second clamping members 12 can be configured for clamping the support 200. The second clamping member 12 can be rotatably connected to the main frame 11 via a second rotating shaft 13, respectively. The two second clamping members 12 can be driven to move close to each other by rotating the second rotating shaft 13 provided on the two sides of the material tank 111, so as to clamp the support 200, and the two second clamping members 12 can be driven to move far away from each other by rotating the second rotating shaft 13 provided on the two sides of the material tank 111, so as to release a clamping of the support 200. Two first clamping members 14 opposite to each other can be further provided on the two side walls of the material tank 111, and the two first clamping members 14 can be rotatably connected to the main frame body 11 via first rotating shafts 15, respectively. The two first clamping members 14 can be driven to move toward each other by rotating the first rotating shafts 15 provided on the two sides of the material tank 111, so as to clamp the plurality of silicon wafers 100, and the two first clamping members 14 can be driven to move away from each other by rotating the first rotating shafts 15 provided on the two sides of the material tank 111, so as to release a clamping of the plurality of silicon wafers 100. Since the silicon wafer 100 is disposed below the support 200 during the transfer process of the silicon wafer 100 and the support 200, in the present embodiment, the second clamping member 14 can be disposed below the second clamping member 12.

Figure 6:
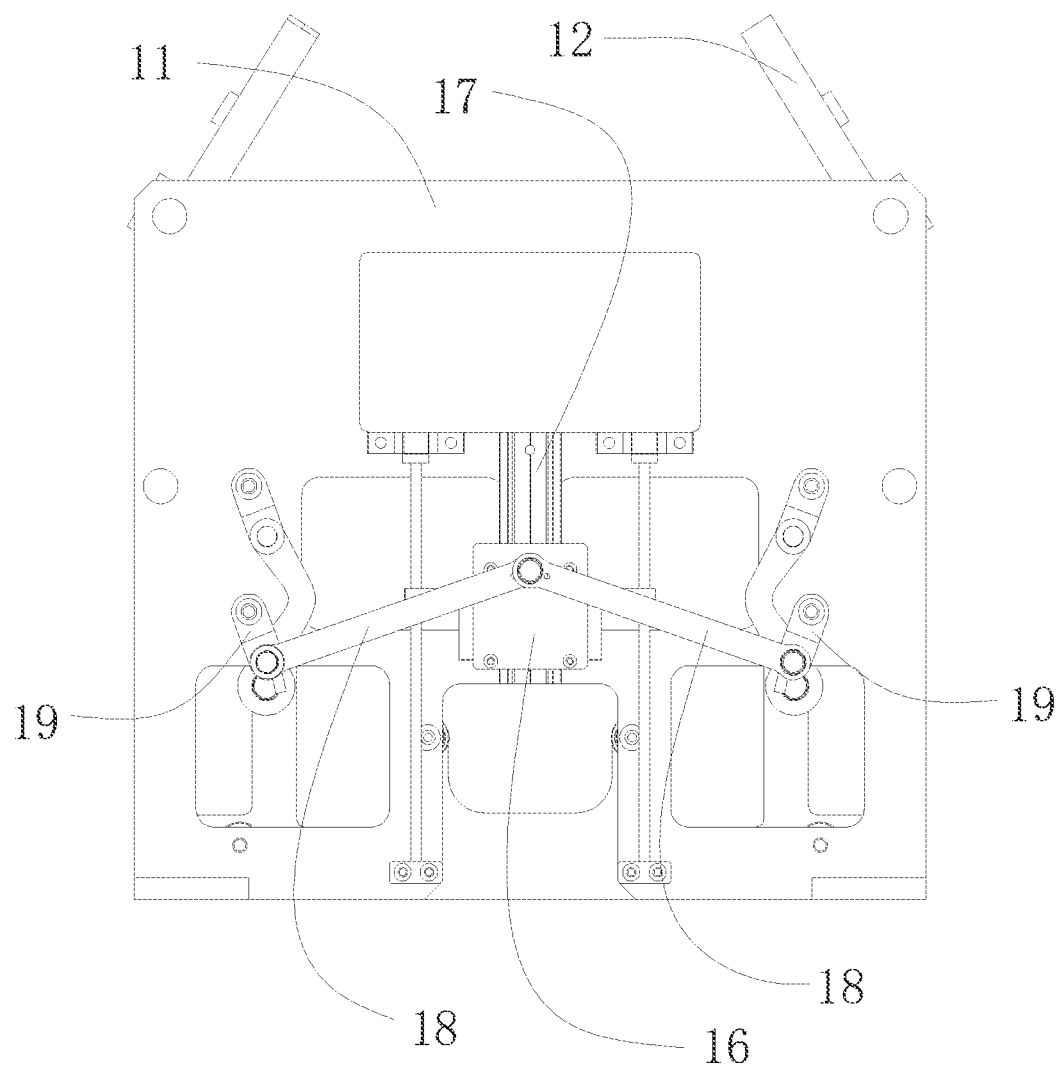
FIG. 6 is a side view of a material frame of a device for degumming and inserting silicon wafers in one or more embodiments of the present disclosure.

Furthermore, as shown in FIG. 6, in order to drive the second rotating shaft 15 to rotate more smoothly, a crank-connecting rod structure can be also arranged between the two first clamping members 14 opposite to each other. The crank-connecting rod structure can include a sliding block 16 and a sliding groove 17 slidably fitting with each other, and the crank-connecting rod structure can also include at least one set of a first connecting rod 18 and a second connecting rod 19. The first connecting rod 18, as a component with a highest degree of freedom in the crank-connecting rod structure, can play a key role in converting a linear motion into a circular motion. Specifically, both ends of the first connecting rod 18 can be pivotally connected to the sliding block 16 and the second connecting rod 19, respectively, and the second connecting rod 19 can be fixedly connected to the second rotating shaft 15. When the sliding block 16 moves relative to the sliding groove 17, the sliding block 16 can drive an end of the first connecting rod 18 connected to the sliding block 16 to perform the linear motion. Then the first connecting rod 18 can apply a driving force from the sliding block 16 to the second connecting rod 19, so that the second connecting rod 19 can drive the second rotating shaft 15 to perform the circular motion. In order to ensure that the structure of the device for degumming and inserting silicon wafers can be more compact, in the present embodiment, only one set of sliding block 16 and sliding groove 17 can be provided, and two sets of the first connecting rod 18 and the second connecting rod 19 can be connected on both sides of the sliding block 16 respectively. In this way, the sliding block 16 can drive the two sets of the first connecting rod 18 and the second connecting rod 19 to move simultaneously when the sliding block 16 moves, and then the first rotating shafts 15 opposite to each other can be driven by the second connecting rod 19 simultaneously, and drive the second clamping member 14 to rotate, so as to clamp the plurality of silicon wafers 100 or release a clamping of the plurality of silicon wafers 100. According to the structure of the above material frame 1, the unlocking mechanism 8 can realize a rotation of the second rotating shaft 15 by driving the sliding block 16 to slidably fit with the sliding groove 17, thereby releasing clamping and fixing of the material frame 1 on the plurality of silicon wafers 100.

In some embodiments, a crank-connecting rod structure can be also arranged between the two second clamping members 12 opposite to each other, and the crank-connecting rod structure arranged between the two second clamping members 12 can work in the same principle as the crank-connecting rod structure arranged between the first clamping members 14.

Figure 15:
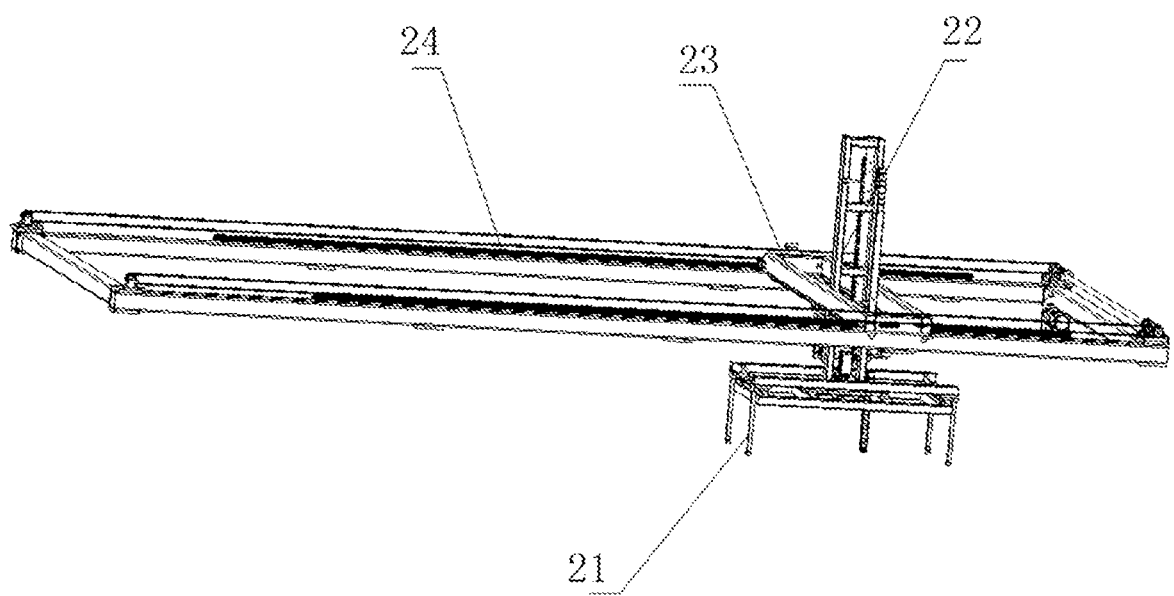
FIG. 15 is a structural diagram of a grabbing mechanism of a device for degumming and inserting silicon wafers in one or more embodiments of the present disclosure.

Referring to FIG. 15, the grabbing mechanism 2 can include a frame manipulator 21, a lifting assembly 22, a longitudinal guide rail 23, and a transversal guide rail 24. The frame manipulator 21 can be installed on the lifting assembly 22, the lifting assembly 22 can be slidably installed on the longitudinal guide rail 23, and the longitudinal guide rail 23 can be slidably installed on the transverse guide rail 24. The lifting assembly 22 and the longitudinal guide rail 23 can be both provided with a motor, so as to realize an automatic sliding.

Figure 7:
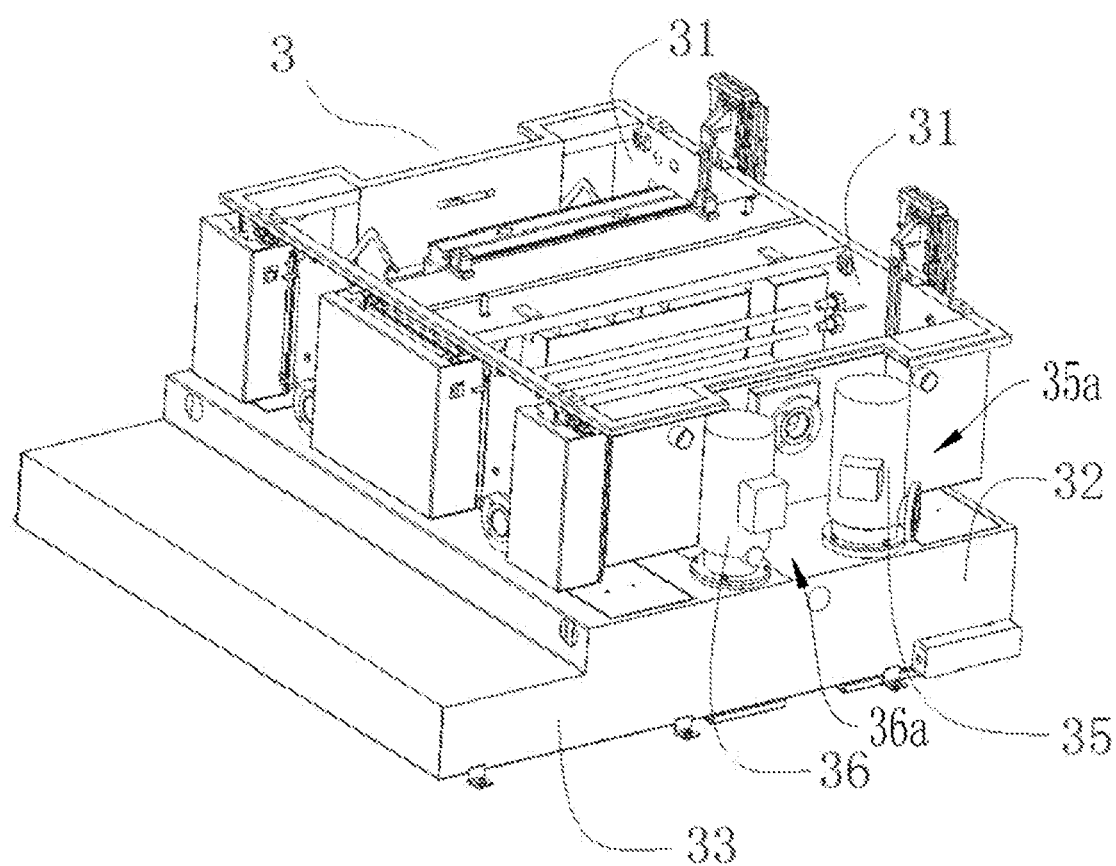
FIG. 7 is a structural diagram of a degumming mechanism of a device for degumming and inserting silicon wafers in one or more embodiments of the present disclosure.
Figure 12:
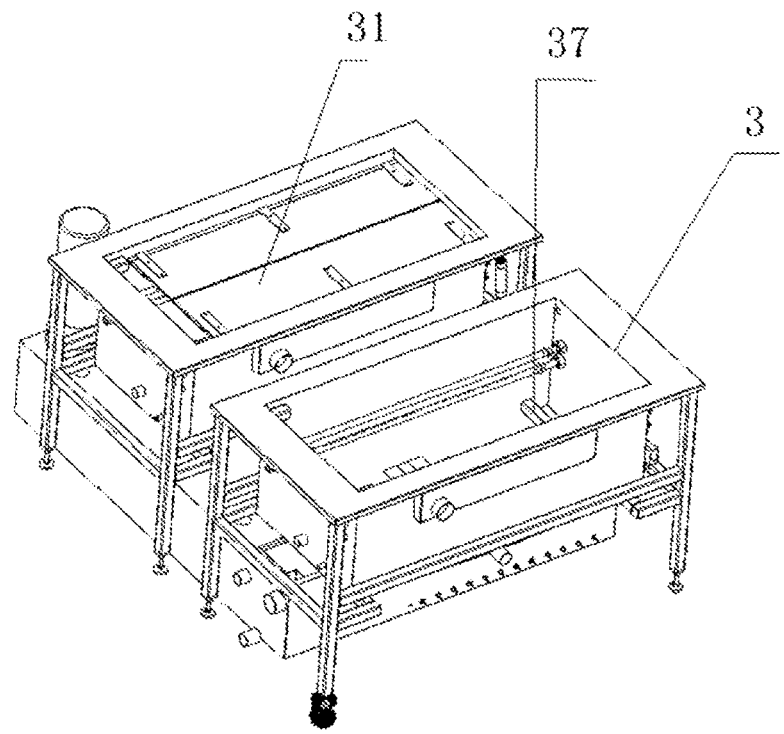
FIG. 12 is a structural diagram of a degumming mechanism of a device for degumming and inserting silicon wafers in one or more embodiments of the present disclosure.

The degumming mechanism 3 provided by the present embodiment can be configured for degumming the plurality of silicon wafers 100 from the support 200. Referring to FIG. 7 and FIG. 12, the degumming mechanism 3 can include a degumming tank 31, an acid storage tank 32, and a water storage tank 33. Both the acid storage tank 32 and the water storage tank 33 can be communicated with the degumming tank 31 through pipes 37, respectively. The water storage tank 33 can be configured for transporting water into the degumming tank 31. Before the degumming process, the silicon wafer 100 can be soaked in water, suspension and silicon powder on a surface of the silicon wafer 100 can be washed off, and colloid attached on the surface of the silicon wafer 100 can be softened. The acid storage tank 32 can be configured for transporting the degumming agent such as the lactic acid into the degumming tank 31, and colloid attached on the surface of the silicon wafer 100 can be completely dissolved in the lactic acid under an action of the degumming agent.

The pipe 37 can be configured for controlling inflow or outflow of the water, and the pipe 37 can include at least a discharge pipe, a liquid inlet pipe, a liquid level detector, and an overflow pipe.

Referring to FIG. 7 and FIG. 12, a first control component 35a can be arranged on the pipe 37 between the degumming tank 31 and the acid storage tank 32, and the first control component 35a is capable of controlling a communication between the degumming tank 31 and the acid storage tank 32 or cutting off the communication between the degumming tank 31 and the acid storage tank 32. A second control component 36a can be arranged on the pipe 37 between the degumming tank 31 and the water storage tank 33, and the second control component 36a is capable of controlling a communication between the degumming tank 31 and the water storage tank 33 or cutting off the communication between the degumming tank 31 and the water storage tank 33. When it is necessary to soften the colloid attached on the surface of the silicon wafer 100, the second control component 36a can control the pipe 37 between the degumming tank 31 and the water storage tank 33 to open, and the first control component 35a can control the pipe 37 between the degumming tank 31 and the acid storage tank 32 to close. At this time, the water storage tank 33 can transport water into the degumming tank 31, and the silicon wafer 100 can be immersed in the water. When it is necessary to dissolve the colloid attached on the surface of the silicon wafer 100, the water in the degumming tank 31 can be drained. Then the first control component 35a can control the pipe 37 between the degumming tank 31 and the acid storage tank 32 to open, and the second control component 36a can control the pipe 37 between the degumming tank 31 and the water storage tank 33 to close. At this time, the acid storage tank 32 can transport the degumming agent such as the lactic acid into the degumming tank 31, and the silicon wafer 100 can be immersed in the degumming agent for degumming. Generally, immersion time of silicon wafer 100 in the water can be 5 minutes, and the immersion time of silicon wafer 100 in the lactic acid can be 10 minutes. The degumming mechanism 3 provided in the present disclosure can realize soaking water and soaking lactic acid of the silicon wafer 100 with only one degumming tank 31. The number of the degumming tanks 31 provided by the degumming mechanism 3 can be greatly reduced, volume of the degumming mechanism 3 can be reduced, and manufacturing cost of the degumming mechanism 3 can be reduced. In order to speed up a degumming rate of the degumming mechanism 3, two or three degumming tanks 31 can also be arranged on the degumming mechanism 3 to realize the degumming process of the plurality of silicon wafers 100 simultaneously.

Usually, as shown in FIG. 7, in order to facilitate picking and placing the silicon wafer 100 in the degumming tank 31, the degumming tank 31 can be arranged above the acid storage tank 32 and the water storage tank 33. In this way, an entire degumming mechanism 3 can occupy a smaller space and be more compact. It is not limited to this, and the degumming tank 31, the acid storage tank 32, and the water storage tank 33 can be also arranged on the same horizontal plane.

As shown in FIG. 7, when the degumming tank 31 is arranged above the acid storage tank 32 and the water storage tank 33, a liquid pump needs to be arranged between the degumming tank 31 and the acid storage tank 32 and between the degumming tank 31 and the water storage tank 33. Specifically, the first control component 35a can include a second liquid pump 35, and the second liquid pump 35 is capable of delivering liquid in the acid storage tank 32 to the degumming tank 31. Since the second liquid pump 35 can quickly transport the liquid in the acid storage tank 32 to the degumming tank 31, improving degumming efficiency of the degumming mechanism 3. The second control component 36a can include a first liquid pump 36, and the first liquid pump 36 is capable of delivering liquid in the water storage tank 33 to the degumming tank 31. Since the first liquid pump 36 can quickly transport the liquid in the water storage tank 33 to the degumming tank 31, improving the degumming efficiency of the degumming mechanism 3.

Figure 8:
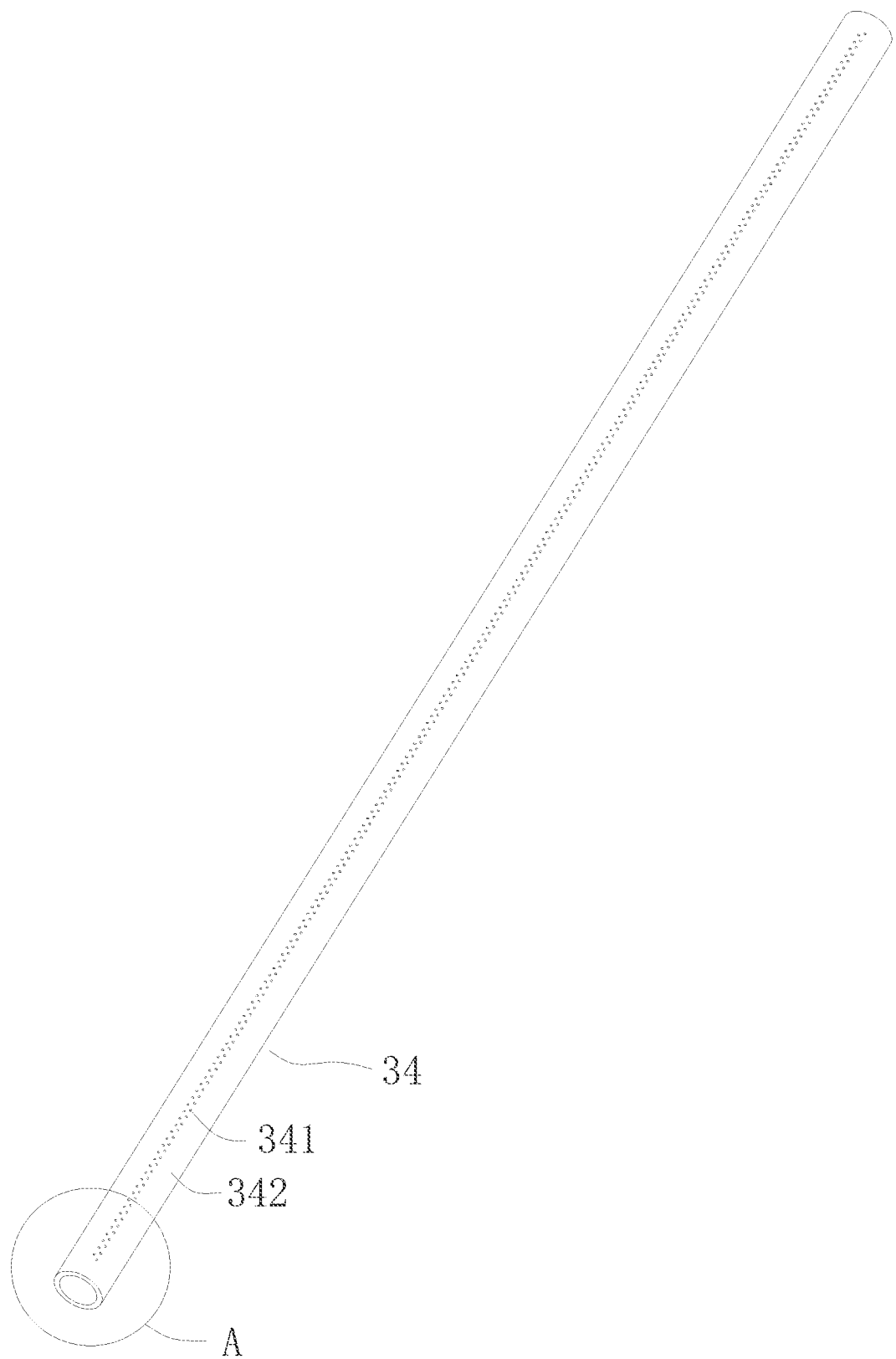
FIG. 8 is a structural diagram of a side nozzle of a device for degumming and inserting silicon wafers in one or more embodiments of the present disclosure.
Figure 9:
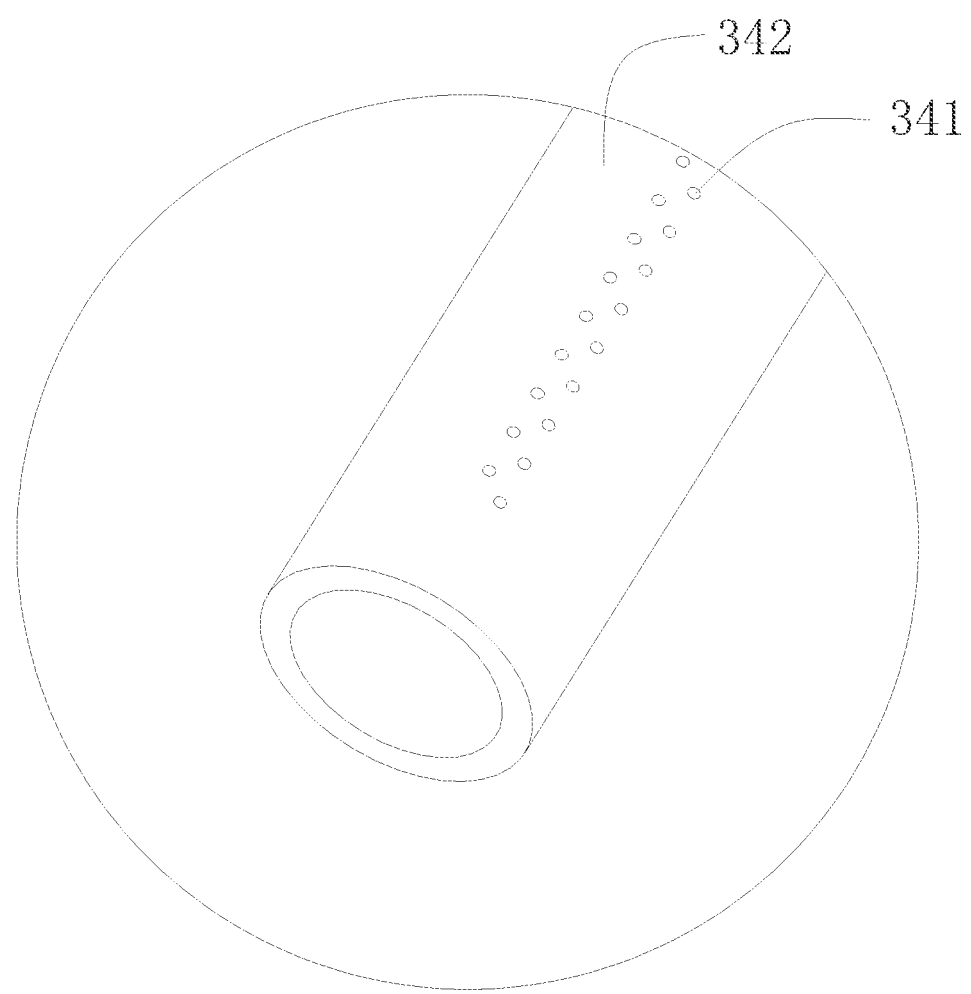
FIG. 9 is an enlargement view of portion "A" of FIG. 8.
Figure 10:
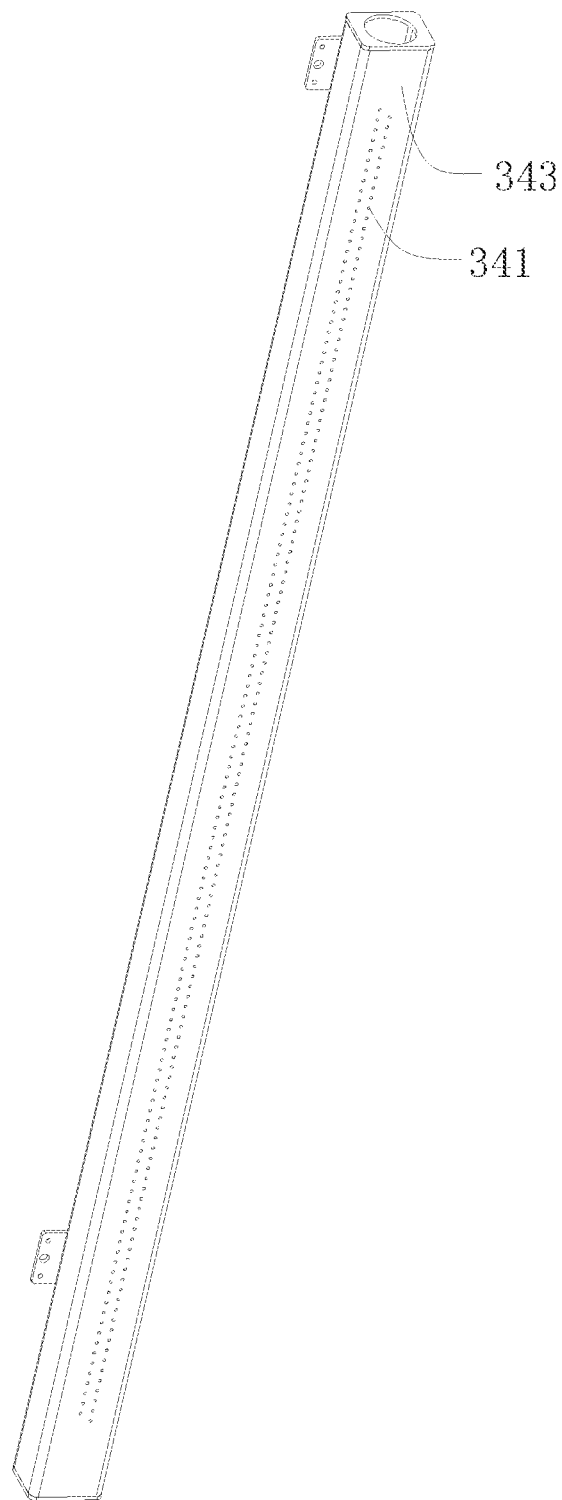
FIG. 10 is a structural diagram of a bottom nozzle of a device for degumming and inserting silicon wafers in one or more embodiments of the present disclosure.

Furthermore, as shown in FIG. 8 to FIG. 10, in order to evenly degum the bonded plurality of silicon wafers 100, the degumming tank 31 can be provided with a spraying pipe 34, and the spraying pipe 34 can be provided with a plurality of spraying holes 341 distributed at uniform intervals along a length direction of the spraying pipe 34. The spraying pipe 34 can be connected to the water storage tank 33 via the pipe 37, and the second control component 36a can include a first liquid pump 36. The first liquid pump 36 is capable of delivering liquid in the water storage tank 33 to the spraying pipe 34, and spraying the liquid from the plurality of spraying holes 341 toward the adjacent plurality of silicon wafers 100. There is a certain impact force when the liquid is sprayed from the spraying hole 341, and the plurality of silicon wafers 100 tightly attached originally can be dispersed when the liquid is sprayed into the gap between adjacent two of the plurality of silicon wafers 100. The spraying holes 341 are evenly distributed on the spraying pipe 34. Therefore, the gaps between different two of the plurality of silicon wafers 100 can be impacted by the same impact force of the liquid. At this time, new gaps formed between the two of the plurality of different silicon wafers 100 can also be the same, that is, the plurality of silicon wafers 100 can be evenly dispersed under the impact force of the liquid.

Specifically, the spraying pipe 34 can be provided in the degumming tank 31, the first liquid pump 36 can be connected to the water storage tank 33 and the spraying pipe 34 via the pipe 37, and the first liquid pump 36 can transport the liquid in the water storage tank 33 to the spraying pipe 34. But not limited to this, the spraying pipe 34 can also directly extract water from the degumming tank 31 via the first liquid pump 36, so as to realize a water circulation inside the degumming tank 31. Furthermore, the spraying pipe 34 can include a pair of side nozzles 342 rotatably disposed on opposite sides of the degumming tank 31, and a bottom nozzle 343 disposed on the bottom of the degumming tank 31.

Figure 11:
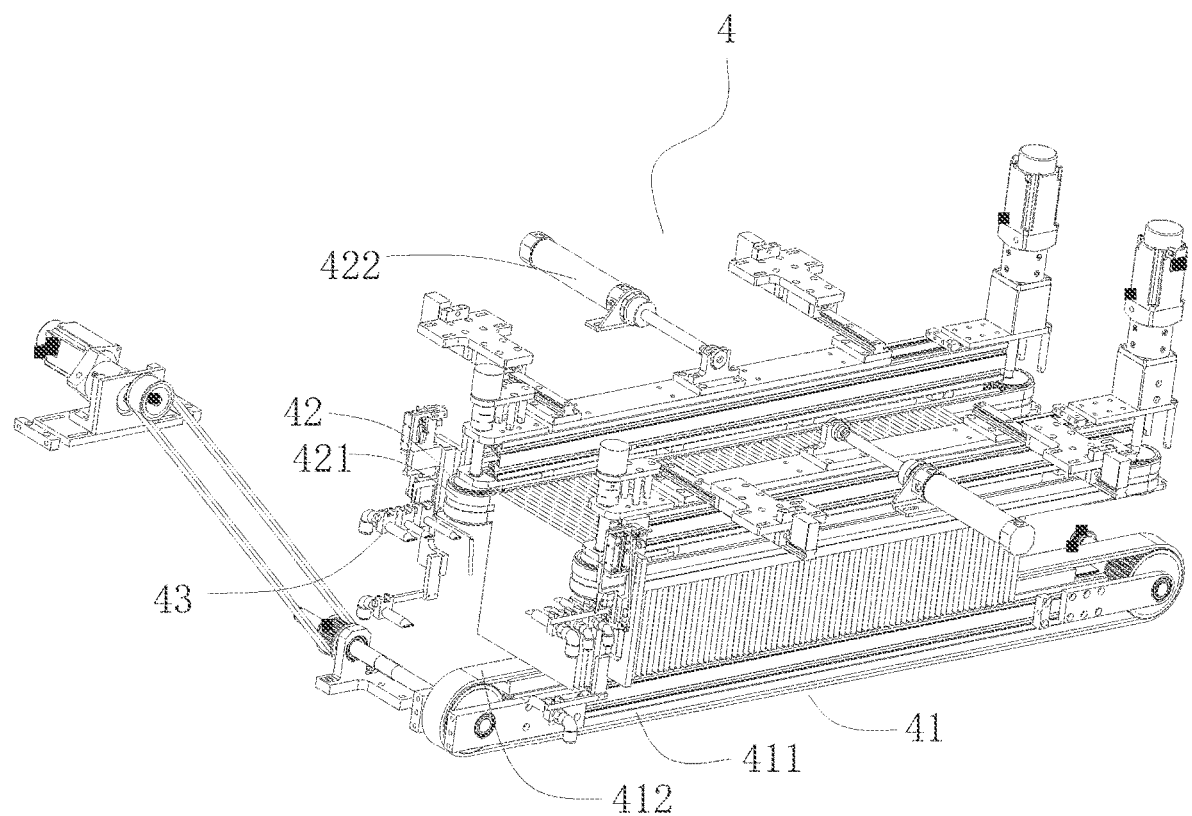
FIG. 11 is a structural diagram of an inserting mechanism of a device for degumming and inserting silicon wafers in one or more embodiments of the present disclosure.
Figure 13:
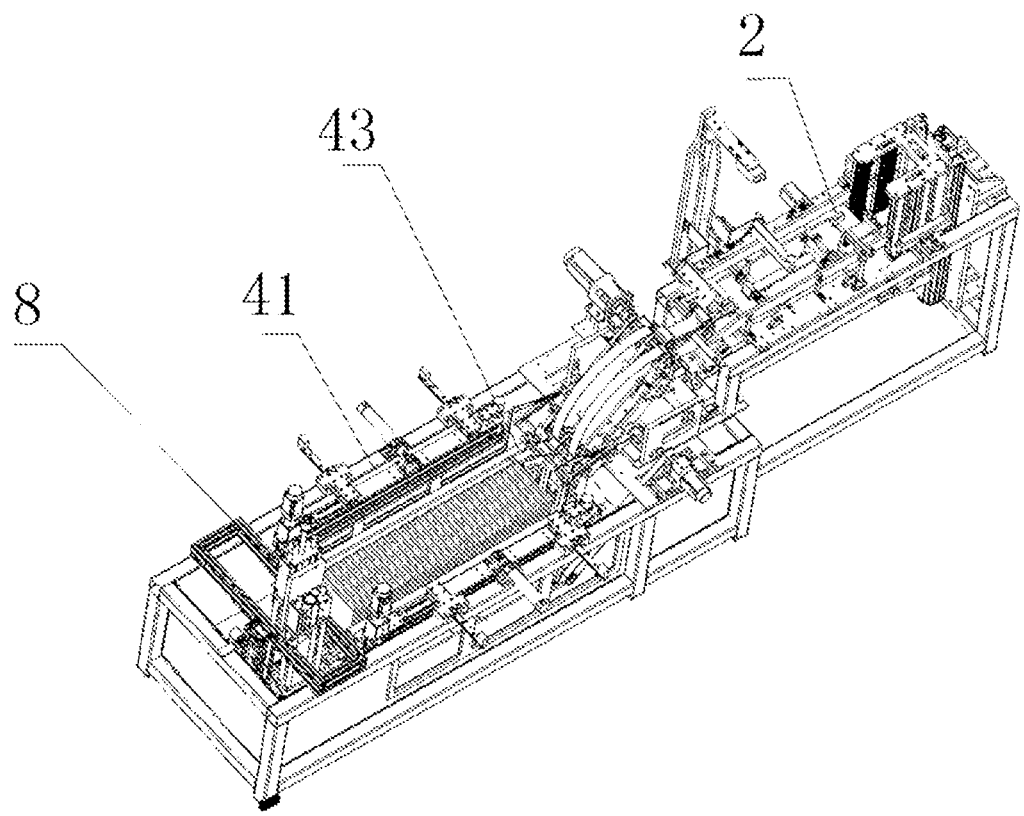
FIG. 13 is a structural diagram of an inserting mechanism of a device for degumming and inserting silicon wafers in one or more embodiments of the present disclosure.
Figure 14:
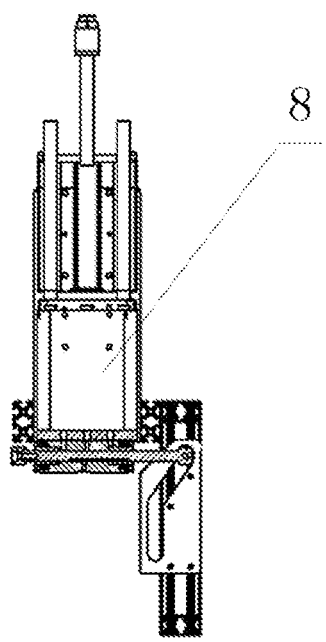
FIG. 14 is a structural diagram of an unlocking mechanism of a device for degumming and inserting silicon wafers in one or more embodiments of the present disclosure.

In some embodiments, referring to FIG. 11 to FIG. 13, the inserting mechanism 4 can include a conveying component 41, a clamping component 42 and a spraying component 43. The silicon wafer 100 and the material frame 1 can be placed on the conveying component 41 together. After that, the unlocking mechanism 8 can release clamping and fixing of the material frame 1 on the plurality of silicon wafers 100, and the conveying component 41 can convey the plurality of silicon wafers 100. In order to ensure o the convey of the silicon wafer 100 by the conveying component 41 and the convey of the plurality of silicon wafers 100 in the inserting mechanism 4 more stable, the clamping component 42 can be disposed at two sides of the conveying component 41, and located above the conveying component 41. The clamping component 42 can not only clamp the plurality of silicon wafers 100 from both sides, but also convey the plurality of silicon wafers 100 synchronously with the conveying component 41 to the spraying component 43 located at an end of the conveying component 41. The spraying component 43 is capable of spraying water on the plurality of silicon wafers 100 to separate the bonded adjacent two of the plurality of silicon wafers 100.

Furthermore, as shown in FIG. 11, the clamping component 42 can include a side belt conveying member 421 and a clamping driving unit 422. The side belt conveying member 421 can be disposed at the two sides of the conveying component 41, and the clamping driving unit 422 can be connected to the side belt conveying member 421 and capable of driving belts of the side belt conveying member 421 to move toward or away from each other, so as to clamp the plurality of silicon wafers 100 or release the clamping of the plurality of silicon wafers 100. Specifically, during a conveying process, the belts of the side belt conveying member 421 can clamp the plurality of silicon wafers 100, and the clamping driving unit 422 can be a driving cylinder or a driving motor, which will not be exemplified here. The driving cylinder can drive the oppositely arranged side belt conveying members 421 to move toward or away from each other, so as to clamp the plurality of silicon wafers 100 or release the clamping of the plurality of silicon wafers 100.

As shown in FIG. 11, a main component of the conveying component 41 can be the bottom belt conveying member 411, and the plurality of silicon wafers 100 can be placed on the belts of the bottom belt conveying member 411. In order to better place the silicon wafer 100 on the bottom belt conveying member 411, the bottom of the material frame 1 can be provided with a larger opening, and the bottom belt conveying member 411 can pass through the opening of the bottom of the material frame 1. When the material frame 1 together with the plurality of silicon wafers 100 is placed on the conveying component 41, the bottom belt conveying member 411 can directly pass through the opening of the bottom of the material frame 1 and touch the bottom of the plurality of silicon wafers 100. The clamping and fixing of the material frame on the plurality of silicon wafers 100 can be released. It enables the plurality of silicon wafers 100 to be placed on the bottom belt conveying member 411, and the material frame 1 to be placed directly on the horizontal plane, thus realizing the separation of the material frame 1 and the plurality of silicon wafers 100. Similarly, in order to better clamp the plurality of silicon wafers 100 by the clamping component 42, the side of the material frame 1 can be also provided with a larger opening, and the clamping component 42 can pass through the opening of the side of the material frame 1.

As shown in FIG. 11, the spraying component 43 can be arranged on a side of the side belt conveying member 421. In order to ensure that the spraying component 43 can spray water on the plurality of silicon wafers 100 more convenient, and avoid interference of the side belt conveying member 421 to the spraying component 43, the bottom belt conveying member 411 and the side belt conveying member 421 of the present disclosure can be arranged partially staggered. Specifically, an end of the bottom belt conveying member 411 proximal to the spraying component 43 protruding forward (i.e., a direction of an end of the side belt conveying member 421) proximal to the spraying component 43 can be defined as an anterior region 412, and the spraying component 43 can be located a side of the anterior region 412. When the side belt conveying member 421 stops moving, the bottom belt conveying member 411 can continue to move forward with the silicon wafer 100 for a certain distance, so that the silicon wafer 100 can be in an oblique state, thereby increasing the gap between adjacent two of the plurality of silicon wafers 100, and facilitating the separation of the plurality of silicon wafers 100 by the spraying component 43.

The working principle of the device for degumming and inserting silicon wafers provided by the present disclosure will be further described below:

Firstly, placing the material frame 1 with the plurality of silicon wafers 100 at a feeding region 6; secondly, grabbing and moving the material frame 1 with the plurality of silicon wafers 100 to the degumming mechanism 3 via the grabbing mechanism 2, to perform a degumming treatment so as to separate the plurality of silicon wafers 100 from the support 200; thirdly, grabbing and removing the support 200 separated from the plurality of silicon wafers 100 via the grabbing mechanism 2, spraying water between the adjacent silicon wafers 100 by the spraying pipe 34, so that the adjacent silicon wafers 100 can be evenly dispersed; wherein when the inserting process of the last plurality of silicon wafers 100 has not been completed, grabbing and removing the material frame 1 with the plurality of silicon wafers 100 to the buffering region 7 and waiting via the grabbing mechanism 2, and when the inserting process of the last plurality of silicon wafers 100 has been completed, grabbing and moving the material frame 1 with the plurality of silicon wafers 100 to the inserting mechanism 4; fourthly, ensuring that the bottom belt conveying member 411 can directly pass through the opening at the bottom of the material frame 1 and touch the bottom of the plurality of silicon wafers 100, and that the side belt conveying member 421 can directly through the opening on the side of the material frame 1 and clamp the side of the silicon wafer 100, wherein the clamping and fixing of the material frame on the plurality of silicon wafers 100 can be released. It enables the plurality of silicon wafers 100 to be placed on the bottom belt conveying member 411, and the material frame 1 to be placed directly on the horizontal plane, thus realizing the separation of the material frame 1 and the plurality of silicon wafers 100; and finally, splitting the degummed plurality of silicon wafers 100 via the inserting mechanism 4, and cleaning and drying one of the plurality of silicon wafers 100.

The above-described embodiments are merely illustrative of several embodiments of the present disclosure, and the description thereof is relatively specific and detailed, but is not to be construed as limiting the scope of the disclosure.

It should be noted that a number of variations and modifications may be made by those skilled in the art without departing from the spirit and scope of the disclosure. Therefore, the scope of the disclosure should be determined by the appended claims.

The technical features of the above-described embodiments may be combined in any combination. For the sake of brevity of description, not all possible combinations of the technical features in the above embodiments are described. However, as long as there is no contradiction between the combinations of these technical features, all should be considered as within the scope of this disclosure.

We claim:

1. A device for degumming and inserting silicon wafers, comprising:
    a material frame configured for placing and clamping a plurality of silicon wafers bonded with a support;
    a grabbing mechanism configured for grabbing and transferring the material frame or the support;
    a degumming mechanism configured for degumming the plurality of silicon wafers from the support;
    an unlocking mechanism configured for releasing clamping and fixing of the material frame on the plurality of silicon wafers; and
    an inserting mechanism configured for splitting the degummed plurality of silicon wafers,
    wherein the inserting mechanism comprises:
    a conveying component configured for placing and conveying the plurality of silicon wafers;
    a clamping component disposed at two sides of the conveying component, wherein the clamping component is capable of clamping the plurality of silicon wafers and conveying the plurality of silicon wafers synchronously; and
    a spraying component disposed at an end of the conveying component, wherein the plurality of silicon wafers are conveyed to the end of the conveying component proximal to the spraying component via the conveying component and the clamping component, and the spraying component is capable of spraying water on the plurality of silicon wafers to separate adjacent two of the plurality of silicon wafers.

2. The device of claim 1, wherein the material frame comprises:
    a main frame body provided with a material tank, wherein the material tank is provided with a wafer outlet, and the wafer outlet is configured for allowing one of the plurality of silicon wafers to pass through; and
    two first clamping members opposite to each other, wherein the two first clamping members are rotatably connected to the main frame body via first rotating shafts, respectively, and the two first clamping members are capable of moving toward or away from each other by rotating the first rotating shafts so as to clamp the plurality of silicon wafers or release a clamping of the plurality of silicon wafers.

3. The device of claim 1, wherein the degumming mechanism comprises a degumming tank, an acid storage tank, and a water storage tank, wherein
    the acid storage tank and the water storage tank are in communication with the degumming tank through pipes, respectively,
    a first control component is arranged on the pipes between the degumming tank and the acid storage tank, and the first control component is capable of controlling a communication between the degumming tank and the acid storage tank or cutting off the communication between the degumming tank and the acid storage tank, and
    a second control component is arranged on the pipes between the degumming tank and the water storage tank, and the second control component is capable of controlling a communication between the degumming tank and the water storage tank or cutting off the communication between the degumming tank and the water storage tank.

4. The device of claim 3, wherein the degumming tank is provided with a spraying pipe, the spraying pipe is provided with a plurality of spraying holes, which are uniformly distributed at intervals along a length direction of the spraying pipe;
the second control component comprises a first liquid pump, and the first liquid pump is capable of delivering liquid to the spraying pipe and spraying the liquid from the plurality of spraying holes toward adjacent two of the plurality of silicon wafers.

5. The device of claim 1, wherein the clamping component comprises a side belt conveying member and a clamping driving unit, the side belt conveying member are disposed at two sides of the conveying component, and the clamping driving unit is connected to the side belt conveying member and capable of driving the side belt conveying member to move toward or away from each other, in order to clamp the plurality of silicon wafers or release a clamping of the plurality of silicon wafers.

6. The device of claim 5, wherein the conveying component comprises a bottom belt conveying member, an end of the bottom belt conveying member proximal to the spraying component protruding forward is defined as an anterior region, and the spraying component is located at a side of the anterior region.

7. The device of claim 1, wherein a buffering region is provided between the degumming mechanism and the inserting mechanism, and the buffering region is configured for accommodating the material frame clamped with the plurality of silicon wafers or empty material frame.

8. The device of claim 1, wherein the degumming mechanism is located on a side of the inserting mechanism, the degumming mechanism and the inserting mechanism are arranged on the same horizontal plane, and the grabbing mechanism is arranged above the degumming mechanism and the inserting mechanism.

9. A method for processing a silicon wafer using the device of claim 1, comprising:
step 1, placing the material frame with the plurality of silicon wafers at a feeding region;
step 2, grabbing and moving the material frame with the plurality of silicon wafers to the degumming mechanism via the grabbing mechanism, to perform a degumming treatment so as to separate the plurality of silicon wafers from the support;
step 3, grabbing and moving the material frame with the plurality of silicon wafers to the inserting mechanism via the grabbing mechanism;
step 4, releasing a clamping and fixing of the plurality of silicon wafers from the material frame via the unlocking mechanism; and
step 5, splitting the degummed plurality of silicon wafers via the inserting mechanism.

10. The method of claim 9, wherein the material frame comprises:
a main frame body provided with a material tank, wherein the material tank is provided with a wafer outlet, and the wafer outlet is configured for allowing one of the plurality of silicon wafers to pass through; and
two first clamping members opposite to each other, wherein the two first clamping members are rotatably connected to the main frame body via first rotating shafts, respectively, and the two first clamping members are capable of moving toward or away from each other by rotating the first rotating shafts so as to clamp the plurality of silicon wafers or release a clamping of the plurality of silicon wafers.

11. The method of claim 9, wherein the degumming mechanism comprises a degumming tank, an acid storage tank, and a water storage tank, wherein
the acid storage tank and the water storage tank are in communication with the degumming tank through pipes, respectively,
a first control component is arranged on the pipes between the degumming tank and the acid storage tank, and the first control component is capable of controlling a communication between the degumming tank and the acid storage tank or cutting off the communication between the degumming tank and the acid storage tank, and
a second control component is arranged on the pipes between the degumming tank and the water storage tank, and the second control component is capable of controlling a communication between the degumming tank and the water storage tank or cutting off the communication between the degumming tank and the water storage tank.

12. The method of claim 11, wherein the degumming tank is provided with a spraying pipe, the spraying pipe is provided with a plurality of spraying holes, which are uniformly distributed at intervals along a length direction of the spraying pipe;
the second control component comprises a first liquid pump, and the first liquid pump is capable of delivering liquid to the spraying pipe and spraying the liquid from the plurality of spraying holes toward adjacent two of plurality of silicon wafers.

13. The method of claim 9, wherein the clamping component comprises a side belt conveying member and a clamping driving unit, the side belt conveying member are disposed at two sides of the conveying component, and the clamping driving unit is connected to the side belt conveying member and capable of driving the side belt conveying member to move toward or away from each other, in order to clamp the plurality of silicon wafers or release a clamping of the plurality of silicon wafers.

14. The method of claim 13, wherein the conveying component comprises a bottom belt conveying member, an end of the bottom belt conveying member proximal to the spraying component protruding forward is defined as an anterior region, and the spraying component is located at a side of the anterior region.

15. The method of claim 9, wherein a buffering region is provided between the degumming mechanism and the inserting mechanism, and the buffering region is configured for accommodating the material frame clamped with the plurality of silicon wafers or empty material frame.

16. The method of claim 9, wherein the degumming mechanism is located on a side of the inserting mechanism, the degumming mechanism and the inserting mechanism are arranged on the same horizontal plane, and the grabbing mechanism is arranged above the degumming mechanism and the inserting mechanism.

* * * * *